(12) United States Patent
Jung et al.

(10) Patent No.: US 10,602,249 B2
(45) Date of Patent: Mar. 24, 2020

(54) ELECTRONIC DEVICE CONDUIT STRUCTURE AND ELECTRONIC DEVICE INCLUDING SAME

(71) Applicant: Samsung Electronics Co., Ltd., Suwon-si, Gyeonggi-do (KR)

(72) Inventors: Minsu Jung, Suwon-si (KR); Younsung Park, Suwon-si (KR); Seunghak Lee, Suwon-si (KR); Wonsun Lee, Suwon-si (KR); Juhyun Kim, Suwon-si (KR); Jongkyun Im, Suwon-si (KR); Taewon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/403,139

(22) Filed: May 3, 2019

(65) Prior Publication Data
US 2019/0342645 A1 Nov. 7, 2019

(30) Foreign Application Priority Data

May 3, 2018 (KR) .................. 10-2018-0051447

(51) Int. Cl.
*H04R 1/02* (2006.01)
*H05K 5/02* (2006.01)
(Continued)

(52) U.S. Cl.
CPC .......... *H04R 1/025* (2013.01); *H04M 1/0249* (2013.01); *H05K 5/0217* (2013.01);
(Continued)

(58) Field of Classification Search
None
See application file for complete search history.

(56) References Cited

U.S. PATENT DOCUMENTS 9,854,339 B2 12/2017 Nagatani et al.
2014/0023223 A1 1/2014 Hwang et al.
(Continued)

FOREIGN PATENT DOCUMENTS

KR 10-2011-0090697 A 8/2011
KR 10-2013-0088982 A 8/2013
(Continued)

OTHER PUBLICATIONS

ISA/KR, International Search Report and Written Opinion of the International Searching Authority, International Application No. PCT/KR2019/004418, dated Jul. 26, 2019, 9 pages.

*Primary Examiner* — Paul W Huber

(57) ABSTRACT

Disclosed is an electronic device including: a display, a speaker, an inner structure including a front surface on which the display is seated, a rear surface having a seating portion for the speaker formed thereon, and a side surface connecting the front surface and the rear surface, and a housing in which the inner structure is seated. The inner structure includes: a first space formed by indentation of a part of the bottom surface of the seating portion toward the front surface of the inner structure, a second space formed to be open toward the front surface of the inner structure such that the second space is connected to and partially overlaps with the first space in a direction defined toward the front surface of the inner structure, and a duct formed to be open toward the side surface of the inner structure such that the duct is connected to and partially overlaps with the second space in a direction defined toward the rear surface of the inner structure.

20 Claims, 22 Drawing Sheets

(51) Int. Cl.
*H04M 1/02* (2006.01)
*H05K 5/00* (2006.01)
(52) U.S. Cl.
CPC ........ *H04R 2499/11* (2013.01); *H05K 5/0017* (2013.01); *H05K 5/0086* (2013.01)

(56) References Cited

U.S. PATENT DOCUMENTS

| | | |
|---|---|---|
| 2017/0013351 A1 | 1/2017 | Lee et al. |
| 2017/0245032 A1 | 8/2017 | Yoon et al. |
| 2018/0014127 A1 | 1/2018 | Zhang et al. |
| 2018/0063633 A1 | 3/2018 | Muramatsu |

FOREIGN PATENT DOCUMENTS

| | | |
|---|---|---|
| KR | 10-2014-0011562 A | 1/2014 |
| KR | 10-2017-0098009 A | 8/2017 |
| WO | 2017200154 A1 | 11/2017 |

(a)            (b)

ELECTRONIC DEVICE CONDUIT STRUCTURE AND ELECTRONIC DEVICE INCLUDING SAME

CROSS-REFERENCE TO RELATED APPLICATION

This application is based on and claims priority under 35 U.S.C. § 119 to Korean Patent Application No. 10-2018-0051447, filed on May 3, 2018, in the Korean Intellectual Property Office, the disclosure of which is incorporated by reference herein in its entirety.

BACKGROUND

1. Field

The disclosure relates to a conduit connecting the inside and outside of an electronic device.

2. Description of Related Art

The above information is presented as background information only to assist with an understanding of the disclosure. No determination has been made, and no assertion is made, as to whether any of the above might be applicable as prior art with regard to the disclosure.

A speaker arranged inside an electronic device may directly emit its sound to the outside, and may also emit the sound to the outside of the electronic device by using a conduit. When the speaker is arranged to directly emit sound therefrom, a complicated structure such as a conduit may become unnecessary, but there may be a limit on the position in which the speaker can be arranged. When a conduit is used to emit sound to the outside, the speaker can be arranged in various positions, but the conduit may increase the thickness of the electronic device.

SUMMARY

An electronic device may have a hole or a conduit formed therein so as to connect the inside and outside of the electronic device. As the electronic device becomes thinner, the space for forming the hole or conduit may be reduced. Particularly, in the case of a hole connected through a side surface of the electronic device, the problem of insufficient space may be exacerbated as the electronic device becomes thinner.

For example, in order to implement a conduit of a component such as a speaker on a side surface of an electronic device, a duct may be needed to convert the path of sound vertically emitted from the speaker into a horizontal path. In the case of a speaker module having a horizontal duct laminated and integrated in the thickness direction of the speaker, the thickness occupied by the speaker module may increase.

An electronic device according to an embodiment may have a duct implemented inside the electronic device so as to convert a speaker sound path into a horizontal path, thereby preventing an increase of the thickness occupied by the speaker, and implementing a conduit toward a side surface of the electronic device.

An electronic device according to an embodiment may include: a display; an electronic component; an inner structure including a front surface on which the display is seated, a rear surface having a seating portion for the electronic component formed thereon, and a side surface connecting the front surface and the rear surface; and a housing in which the inner structure is seated. The inner structure may include: a first space formed by indentation of a part of the bottom surface of the seating portion toward the front surface of the inner structure; a second space formed to be open toward the front surface of the inner structure such that the second space is connected to and partially overlaps with the first space in a direction defined toward the front surface of the inner structure; and a duct formed to be open toward the side surface of the inner structure such that the duct is connected to and partially overlaps with the second space in a direction defined toward the rear surface of the inner structure.

A conduit structure according to an embodiment may include: an inner structure including a front surface on which a display is seated, a rear surface having a seating portion for an electronic component formed thereon, and a side surface connecting the front surface and the rear surface; and a housing in which the inner structure is seated. The inner structure may include: a first space formed by indentation of a part of the bottom surface of the seating portion toward the front surface of the inner structure; a second space formed to be open toward the front surface of the inner structure such that the second space is connected to and partially overlaps with the first space in a direction defined toward the front surface of the inner structure; and a duct formed to be open toward the side surface of the inner structure such that the duct is connected to and partially overlaps with the second space in a direction defined toward the rear surface of the inner structure.

The speaker sound path may be converted into a horizontal path such that a conduit is implemented toward a side surface of the electronic device. This increases the degree of freedom of component arrangement in connection with designing the electronic device, and makes it possible to design the electronic device thinner.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the disclosure and its advantages, reference is now made to the following description taken in conjunction with the accompanying drawings, in which like reference numerals represent like parts.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
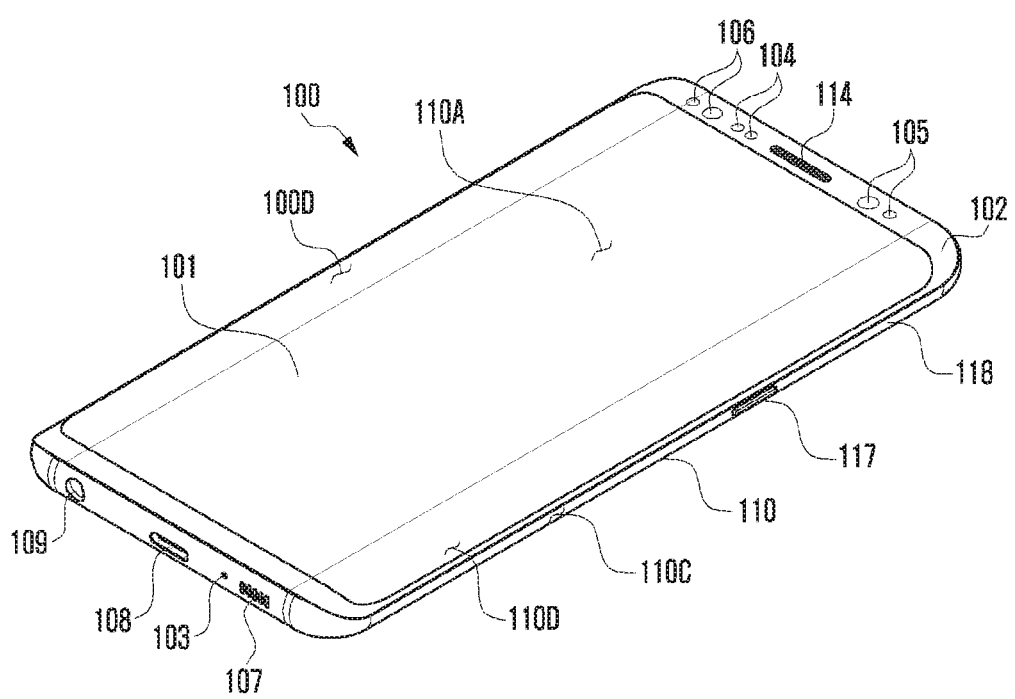
FIG. 1 illustrates a perspective view of the front surface of a mobile electronic device according to an embodiment.
Figure 2:
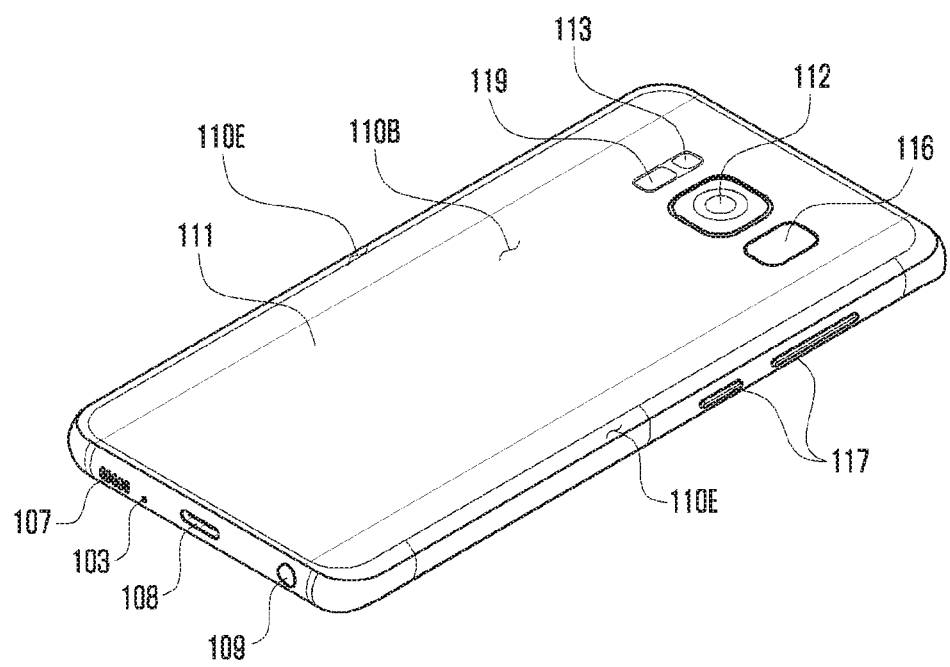
FIG. 2 illustrates a perspective view of the rear surface of the electronic device of FIG. 1.

Referring to FIG. 1 and FIG. 2, an electronic device 100 according to an embodiment may include a housing 110 including a first surface (or front surface) 110A, a second surface (or rear surface) 110B, and a side surface 110C surrounding the space between the first surface 110A and the second surface 110B. In another embodiment (not illustrated), the housing may denote a structure that forms a part of the first surface 110A, the second surface 110B, and the side surface 110C illustrated in FIG. 1. According to an embodiment, the first surface 110A may be formed by a front plate 102, at least a part of which is substantially transparent (for example, a glass plate including various coating layers, or a polymer plate). The second surface 110B may be formed by a rear plate 111 that is substantially opaque. The rear plate 111 may be made of coated or colored glass, ceramic, polymer, metal (for example, aluminum, stainless steel (STS), or magnesium), or a combination of at least two of the above-mentioned materials. The side surface 110C may be formed by a side bezel structure (or "side member") 118 which is coupled to the front plate 102 and to the rear plate 111, and which includes metal and/or polymer. In some embodiments, the rear plate 111 and the side bezel structure 118 may be formed integrally and may include the same material (for example, a metal material such as aluminum).

In the illustrated embodiment, the front plate 102 may include two first areas 110D on both ends of the long edge of the front plate 102 such that the two first areas 110D bend from the first surface 110A toward the rear plate 111 and extend seamlessly. In the illustrated embodiment (see FIG. 2), the rear plate 111 may include two second areas 110E on both ends of the long edge such that the two second areas 110E bend from the second surface 110B toward the front plate 102 and extend seamlessly. In some embodiments, the front plate 102 (or the rear plate 111) may include only one of the first areas 110D (or the second areas 110E). In another embodiment, a part of the first areas 110D or the second areas 110E may not be included. In the above embodiments, when seen from the side surface of the electronic device 100, the side bezel structure 118 may have a first thickness (or width) on a part of the side surface, which does not include the first areas 110D or the second areas 110E as described above, and may have a second thickness that is smaller than the first thickness on a part of the side surface, which includes the first areas 110D or the second areas 110E.

According to an embodiment, the electronic device 100 may include at least one of a display 101, audio modules 103, 107, and 114, sensor modules 104, 116, and 119, camera modules 105, 112, and 113, a key input device 117, a light-emitting element 106, and connector holes 108 and 109. In some embodiments, at least one of the constituent elements (for example, the key input device 117 or the light-emitting element 106) of the electronic device 100 may be omitted, or the electronic device 100 may additionally include another constituent element.

The display 101 may be exposed through a corresponding part of the front plate 102, for example. In some embodiments, at least a part of the display 101 may be exposed through the front plate 102 that forms the first areas 110D of the side surface 110C and the first surface 110A. In some embodiments, the display 101 may have a corner formed in substantially the same shape as that of the adjacent outer periphery of the front plate 102. In another embodiment (not illustrated), in order to increase the area of exposure of the display 101, the interval between the outer periphery of the display 101 and the outer periphery of the front plate 102 may be formed to be substantially identical.

In another embodiment (not illustrated), a recess or an opening may be formed in a part of the screen display area of the display 101, and at least one of an audio module 114, a sensor module 104, a camera module 105, and a light-emitting element 106 may be included and aligned with the recess or the opening. In another embodiment (not illustrated), on the back surface of the screen display area of the display 101, at least one of an audio module 114, a sensor module 104, a camera module 105, a fingerprint sensor 116, and a light-emitting element 106 may be included. In another embodiment (not illustrated), the display 101 may be coupled to or arranged adjacent to a touch sensing circuit, a pressure sensor capable of measuring the intensity (pressure) of a touch, and/or a digitizer that detects a magnetic field-type stylus pen. In some embodiments, at least a part of the sensor modules 104 and 119 and/or at least a part of the key input device 117 may be arranged in the first areas 110D and/or the second areas 110E.

The audio modules 103, 107, and 114 may include a microphone hole 103 and speaker holes 107 and 114. A microphone for acquiring an external sound may be arranged in the microphone hole 103, and a plurality of microphones may be arranged therein such that the direction of a sound can be sensed in some embodiments. The speaker holes 107 and 114 may include an outer speaker hole 107 and a speech receiver hole 114. In some embodiments, the speaker holes 107 and 114 and the microphone hole 103 may be implemented as a single hole, or a speaker may be included (for example, a piezoelectric speaker) without the speaker holes 107 and 114.

The sensor modules 104, 116, and 119 may generate an electric signal or a data value corresponding to the internal operating condition of the electronic device 100 or the external environment condition thereof. The sensor modules 104, 116, and 119 may include, for example, a first sensor module 104 (for example, a proximity sensor) arranged on the first surface 110A of the housing 110, and/or a second sensor module (not illustrated) (for example, a fingerprint sensor), and/or a third sensor module 119 (for example, an HRM sensor) arranged on the second surface 110B of the housing 110, and/or a fourth sensor module 116 (for example, a fingerprint sensor). The fingerprint sensor may be arranged not only on the first surface 110A (for example, the display 101) of the housing 110, but also on the second surface 110B thereof. The electronic device 100 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules 105, 112, and 113 may include a first camera device 105 arranged on the first surface 110A of the electronic device 100, a second camera device 112 arranged on the second surface 110B thereof, and/or a flash 113. The camera devices 105 and 112 may include a single lens or a plurality of lenses, an image sensor, and/or an image signal processor. The flash 113 may include, for example, a light-emitting diode or a xenon lamp. In some embodiments, two or more lenses (an infrared camera, a wide-angle lens, and a telephoto lens) and image sensors may be arranged on a single surface of the electronic device 100.

The key input device 117 may be arranged on the side surface 110C of the housing 110. In another embodiment, the electronic device 100 may not include a part of the above-mentioned key input device 117 or the entire key input device 117, and the key input device 117 (not included) may be implemented in another type, such as a soft key, on the display 101. In some embodiments, the key input device may include a sensor module 116 arranged on the second surface 110B of the housing 110.

The light-emitting element 106 may be arranged on the first surface 110A of the housing 110, for example. The light-emitting element 106 may provide information regarding the condition of the electronic device 100 in a light type, for example. In another embodiment, the light-emitting element 106 may provide a light source that interworks with operation of the camera module 105, for example. The light-emitting element 106 may include, for example, an LED, an IR LED, and a xenon lamp.

The connector holes 108 and 109 may include a first connector hole 108 capable of containing a connector (for example, a USB connector) for transmitting/receiving power and/or data to/from an external electronic device, and/or a second connector hole (for example, an earphone jack) 109 capable of containing a connector for transmitting/receiving an audio signal to/from the external electronic device.

Figure 3:
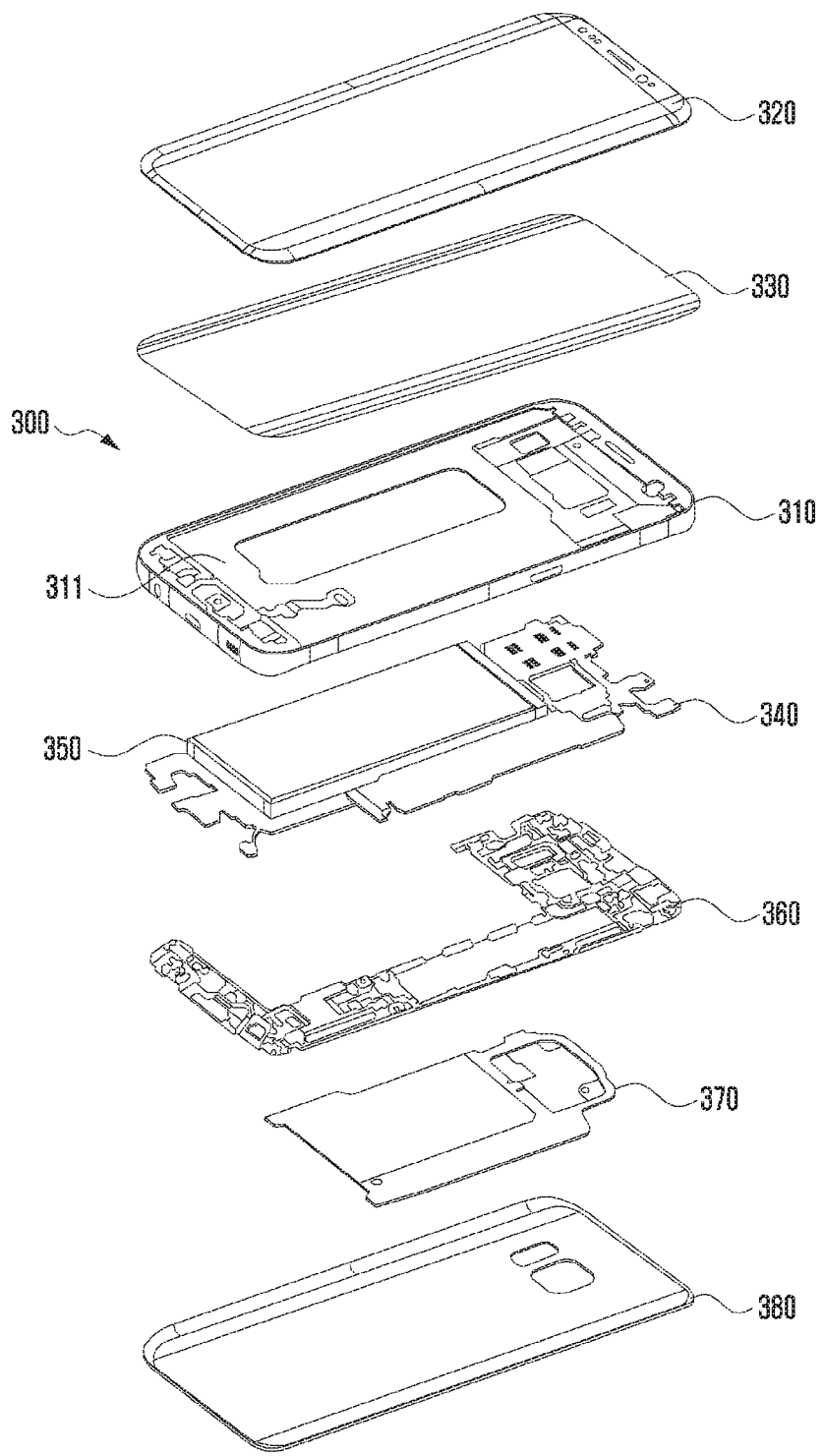
FIG. 3 illustrates a developed perspective view of the electronic device of FIG. 1.
Figure 4:
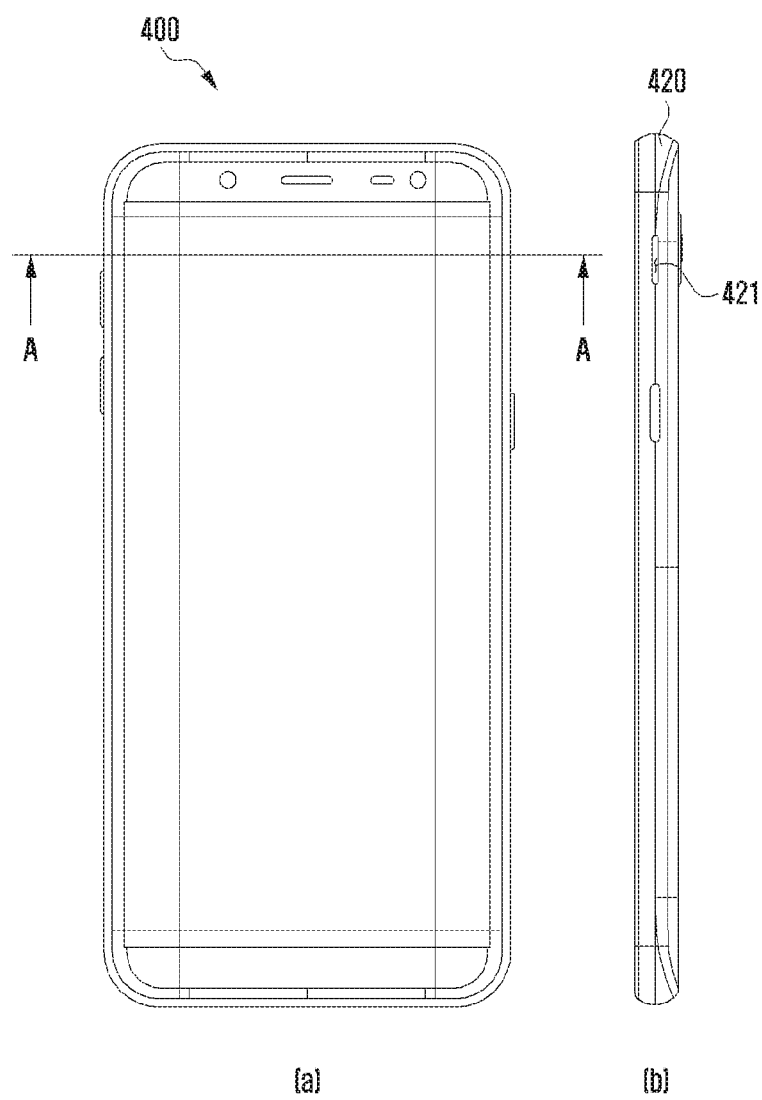
FIG. 4A illustrates an electronic device according to an embodiment.
FIG. 4B illustrates an electronic device according to an embodiment.

Referring to FIG. 3, the electronic device 300 may include a side bezel structure 310, a first support member 311 (for example, a bracket), a front plate 320, a display 330, a printed circuit board 340, a battery 350, a second support member 360 (for example, a rear case), an antenna 370, and a rear plate 380. In some embodiments, at least one of the constituent elements (for example, the first support member 311 or the second support member 360) of the electronic device 300 may be omitted, or the electronic device 300 may further include another constituent element. At least one of the constituent elements of the electronic device 300 may be identical or similar to at least one of the constituent elements of the electronic device 100 of FIG. 1 or FIG. 2, and repeated descriptions thereof will be omitted herein.

The first support member 311 may be arranged inside the electronic device 300 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and the printed circuit board 340 may be coupled to the other surface thereof. A processor, a memory, and/or an interface may be mounted on the printed circuit board 340. The processor may include, for example, one or more of a central processing device, an application processor, a graphic processing device, an image signal processor, an sensor hub processor, or a communication processor.

The memory may include a volatile memory or a nonvolatile memory, for example.

The interface may include, for example, a high definition multimedia interface (HDMI), a universal serial bus (USB) interface, an SD card interface, and/or an audio interface. The interface may connect the electronic device 300 with an external electronic device electrically or physically, for example, and may include a USB connector, an SD card/MMC connector, or an audio connector.

The battery 350 is an device for supplying power to at least one constituent element of the electronic device 300, and may include a non-rechargeable primary cell, a rechargeable secondary cell, or a fuel cell, for example. At least a part of the battery 350 may be arranged on substantially the same plane with the printed circuit board 340, for example. The battery 350 may be arranged integrally inside the electronic device 300, or may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device or may wirelessly transmit/receive power necessary for charging, for example. In another embodiment, an antenna structure may be formed by a part or a combination of the side bezel structure 310 and/or the first support member 311.

FIG. 4A illustrates an electronic device according to an embodiment. FIG. 4B illustrates an electronic device according to an embodiment.

FIG. 4A illustrates the front surface of an electronic device 400 according to an embodiment. FIG. 4B illustrates the right surface of the electronic device 400 according to an embodiment. Particularly, FIG. 4B illustrates the position in which an opening 421 is formed according to an embodiment. As illustrated in FIG. 4B, the opening 421 of the conduit structure according to an embodiment may be formed on a side surface of the electronic device 400. Although the opening 421 is illustrated in FIG. 4A, for example, as being formed on the right surface of the electronic device 400 with reference to the condition illustrated in FIG. 4A, the same is not limited thereto, and may also be formed on the left surface, upper surface, or the lower surface.

Figure 5:
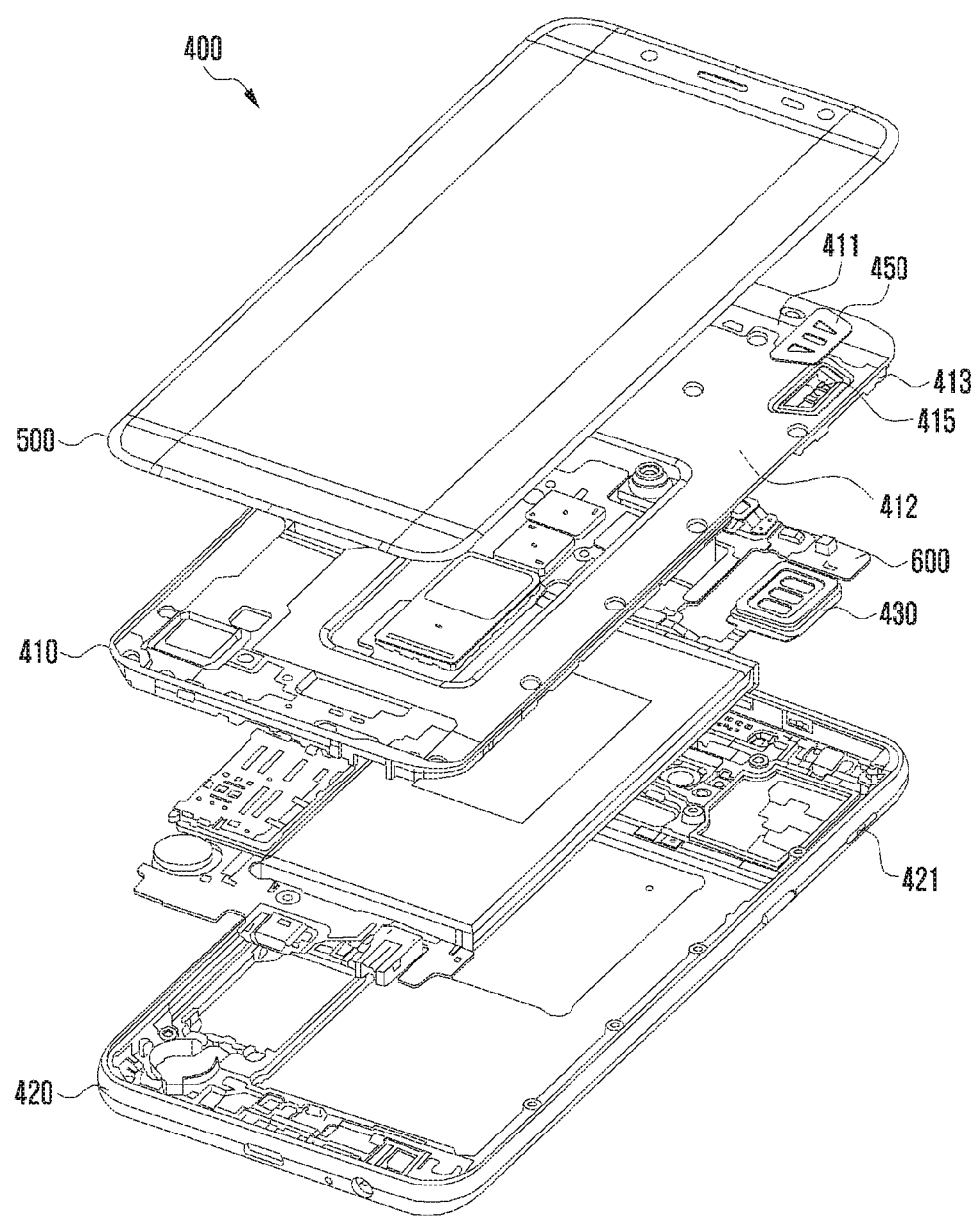
FIG. 5 illustrates an exploded perspective view of an electronic device according to an embodiment.

FIG. 5 illustrates an exploded perspective view of the electronic device 400 according to an embodiment.

The electronic device 400 according to an embodiment may include an inner structure 410 and a housing 420.

The inner structure 410 according to an embodiment may provide a frame such that various components of the electronic device 400 can be seated on and coupled to the same, and may correspond to the support member 311 of FIG. 3. For example, an electronic component such as the speaker 430 according to an embodiment or a component such as the printed circuit board 600 may be seated thereon.

Although various embodiments are described with reference to a speaker 430 as an exemplary electronic component, the same are not limited thereto. For example, other electronic components requiring a conduit, such as a microphone and a gas sensor, than the speaker 430 may be seated thereon. The printed circuit board 600 according to various embodiments may correspond to the printed circuit board 340 illustrated in FIG. 3. The printed circuit board 600 according to various embodiments may include not only processors such as a central processing device, an application processor, and a graphic processing device, but also a memory that stores various kinds of data and command systems temporarily, permanently, or selectively.

The inner structure 410 according to an embodiment may include a front surface 411 on which a display 500 is seated, a rear surface 412 having a seating portion 417 (see FIG. 6B) formed thereon such that a speaker 430 is seated thereon, and a side surface 413 connecting the front surface 411 and the rear surface 412. With reference to the condition illustrated in FIG. 5, the upper surface may correspond to the front surface 411, and the lower surface may correspond to the rear surface 412. The display 500 according to an embodiment may be identical or similar to the display 330 illustrated in FIG. 3. The seating portion 417 according to an embodiment may be formed by indentation of a part of the rear surface 412 of the inner structure 410 toward the front surface.

On the seating portion 417 according to an embodiment, not only the speaker 430, but also a component requiring a conduit structure, by which the same is connected to the outside of the electronic device 400, may be seated. For example, a microphone, a gas sensor, or the like may be seated thereon.

Figure 6A:
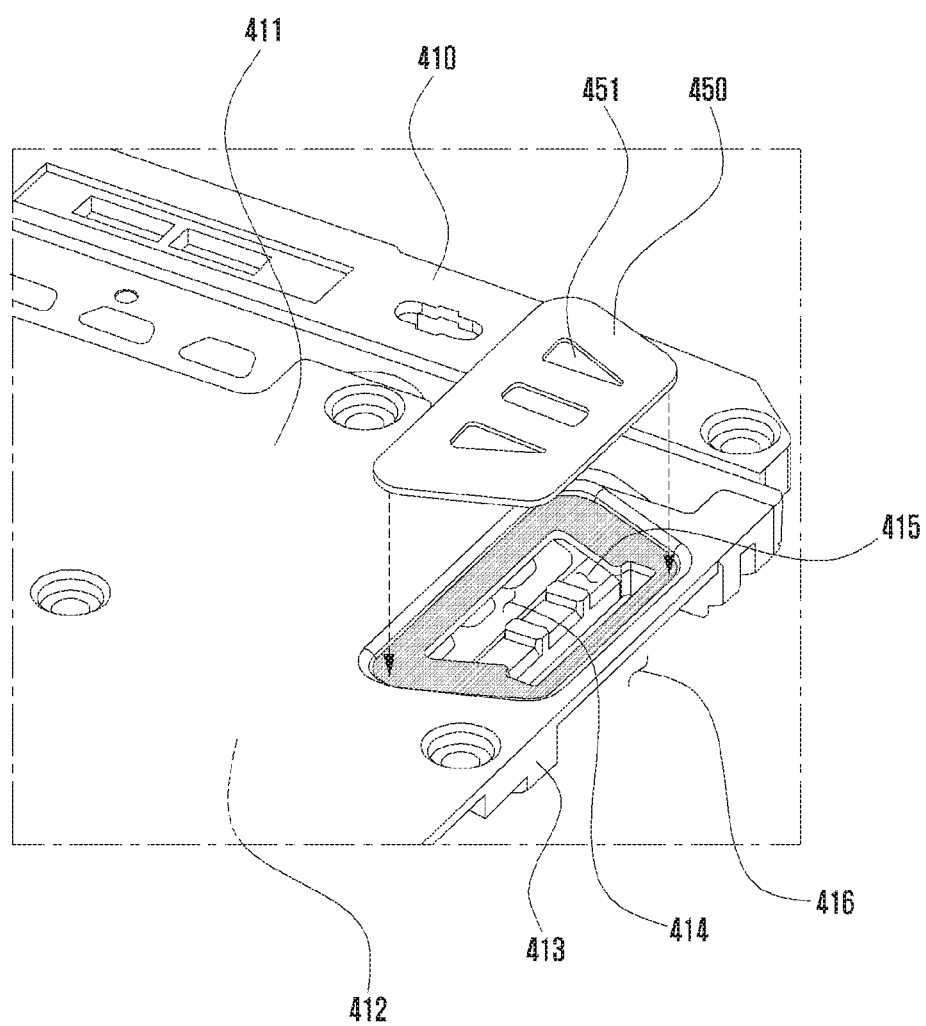
FIG. 6A illustrates an exploded perspective view mainly illustrating a part of an electronic device according to an embodiment, which forms a conduit structure.

The inner structure 410 according to an embodiment may include a first space 414 (see FIG. 6A), a second space 415, and a duct 416 (see FIG. 6A). The first space 414 may be formed by indentation of a part of the bottom surface of the seating portion 417 toward the front surface of the inner structure 410. The second space 415 may be formed toward the front surface of the inner structure 410 so as to partially overlap with the first space 414 such that the overlapping parts are connected to each other, and may be formed to be open toward the front surface of the inner structure 410. The duct 416 may be formed toward the rear surface of the inner structure 410 so as to partially overlap with the second space 415 such that the overlapping parts are connected to each other, and may be formed to be open toward the side surface of the inner structure 410. The part of the second space 415, which is open toward the front surface of the inner structure 410, may be sealed by a sealing plate 450.

The housing 420 according to an embodiment may provide a frame for maintaining the overall shape of the electronic device 400. Various components constituting the electronic device 400 may be seated on the housing 420. For example, according to an embodiment, the inner structure 410 may be seated thereon. The housing 420 may have an opening 421 formed in a position corresponding to that of the duct 416 of the inner structure 410.

According to an embodiment, a conduit structure may be formed by the first space 414, the second space 415, the duct 416, and the opening 421 of the housing 420.

Figure 6B:
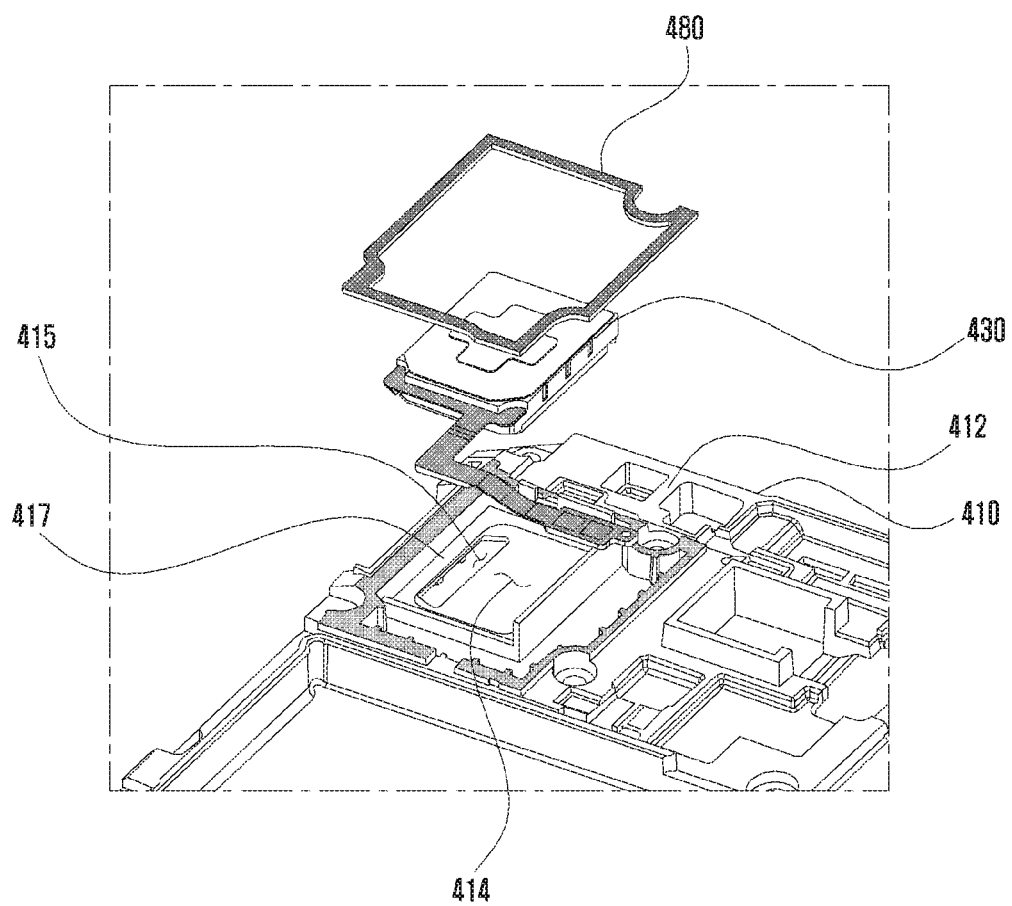
FIG. 6B illustrates an exploded perspective view mainly illustrating a part of an electronic device according to an embodiment, which forms a conduit structure.

FIG. 6A illustrates an exploded perspective view mainly illustrating a part of the electronic device 400 (see FIG. 4) according to an embodiment, which forms a conduit structure. FIG. 6B is an exploded perspective view mainly illustrating a part of the electronic device 400 (see FIG. 4) according to an embodiment, which forms a conduit structure.

FIG. 6A illustrates the first space 414, the second space 415, the connecting part of the duct 416, and the position of sealing plate 450 in connection with the front surface 411 of the inner structure 410. FIG. 6B illustrates the first space 414, the seating portion 417, and the speaker 430 seated on the seating portion 417 in connection with the rear surface 412 of the inner structure 410.

Referring to FIG. 6A, the first space 414 may be a space formed between the speaker and the inner structure 410, and the duct 416 may be configured as a groove formed by indentation from the side surface 413 of the inner structure 410 toward the inside of the inner structure 410 by a predetermined depth. The second space 415 may overlap with a part of the first space 414 and with a part of the duct 416 so as to connect the first space 414 and the duct 416 to each other.

The second space 415 according to an embodiment may be formed to be open to the front surface 411 of the inner structure 410 so as to facilitate molding or manufacturing of the inner structure 410. The open part may be sealed by a sealing plate 450. When the same is not sealed, the sound generated by the speaker 430 seated on the seating portion 417 (see FIG. 6B) may diffuse into the electronic device 400 (see FIG. 5) through the space between the display 500 and the inner structure 410, thereby lowering the output of the sound transferred to the outside of the electronic device.

According to an embodiment, the second space 415 may be sealed by a sealing plate 450 as illustrated in FIG. 6A so as to prevent the sound from diffusing into the electronic device 400 and to gather the sound such that the same is discharged through the duct 416 and the opening 421 (see FIG. 5) of the housing 420 (see FIG. 5).

Referring to FIG. 6B, the seating portion 417 may be a space formed by indentation from the rear surface 412 of the inner structure 410 toward the front surface such that a speaker 430 can be seated therein.

A fourth sealing member 480 may be arranged on the seating portion 417 according to an embodiment so as to seal the space between the housing 420 (see FIG. 5) and the seating portion 417 such that, when the inner structure 410 is seated on the housing 420 (see FIG. 5), the sound does not diffuse to parts other than the first space 414. The fourth sealing member 480 may be made of a material which can deform elastically, and which can fill and seal the space between the housing 420 and the seating portion 417. For example, the fourth sealing member 480 may be made of a material such as rubber or sponge. The fourth sealing member 480 may be fixed by an adhesive material such as a tape, or may be compressed and fixed in the process of assembling the housing 420 and the inner structure 410.

Referring to FIG. 6B, reference numeral 415 seems to denote a hole formed in the first space 414, but may refer to the second space 415 illustrated in FIG. 6A.

Figure 7A:
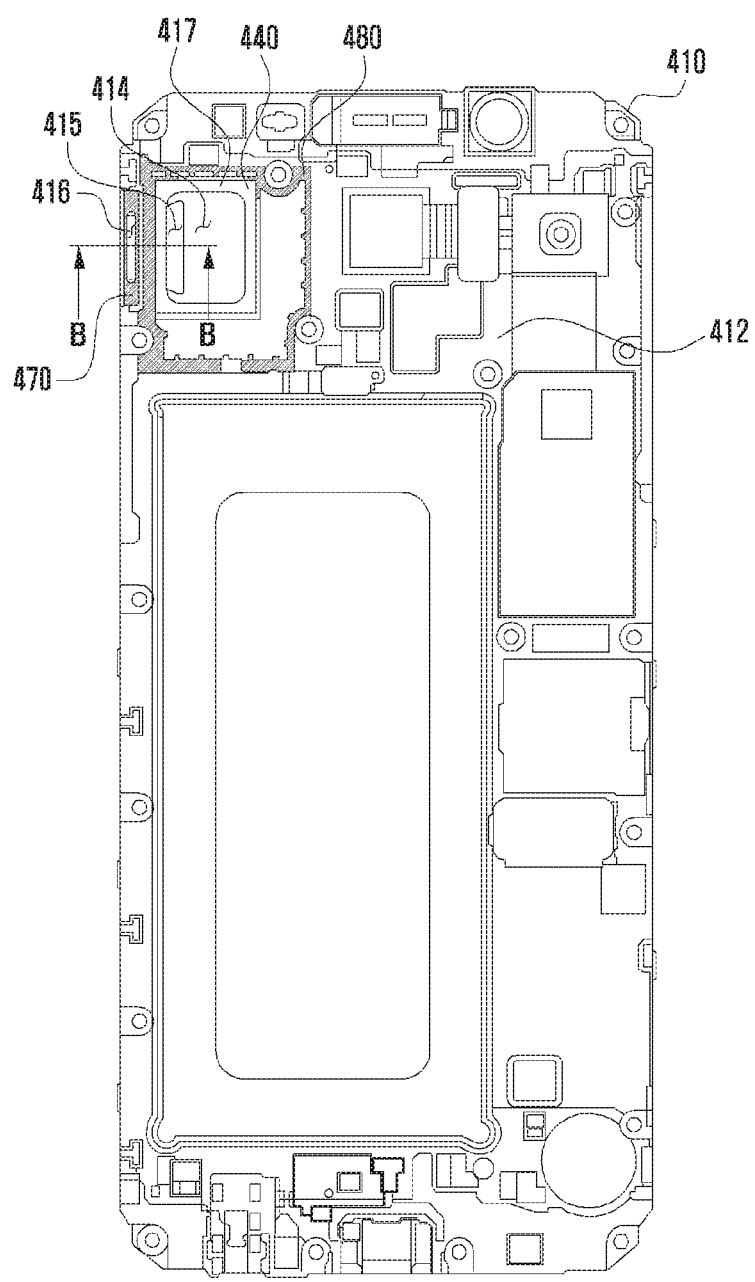
FIG. 7A illustrates an individual component that forms a conduit structure of an electronic device according to an embodiment.
Figure 7B:
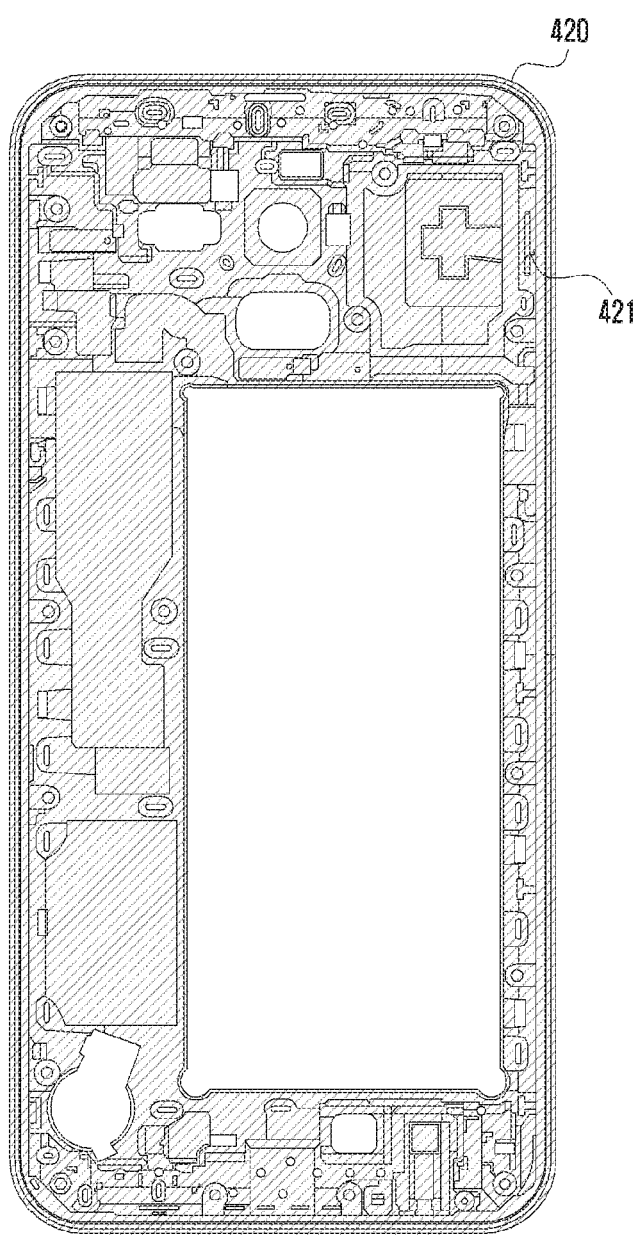
FIG. 7B illustrates an individual component that forms a conduit structure of an electronic device according to an embodiment.
Figure 7C:
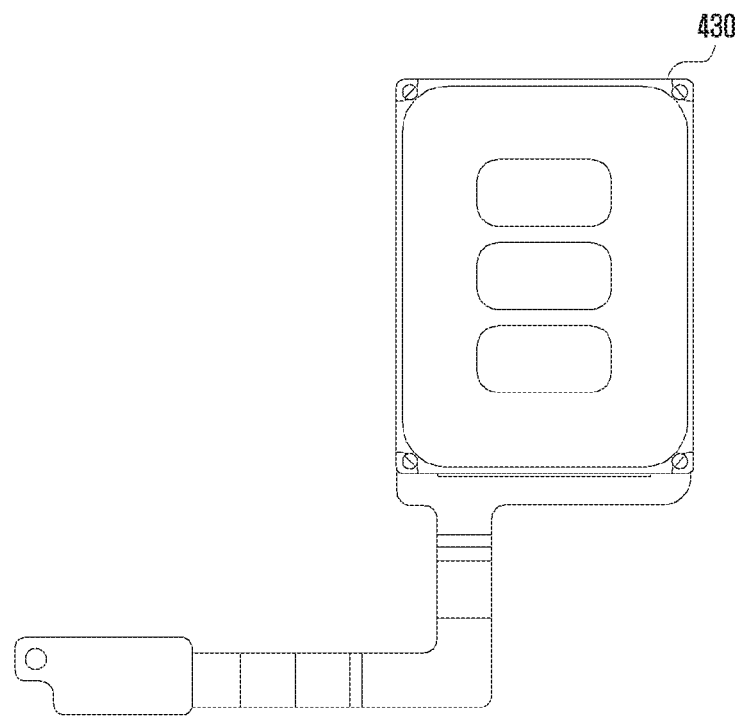
FIG. 7C illustrates an individual component that forms a conduit structure of an electronic device according to an embodiment.
Figure 7D:
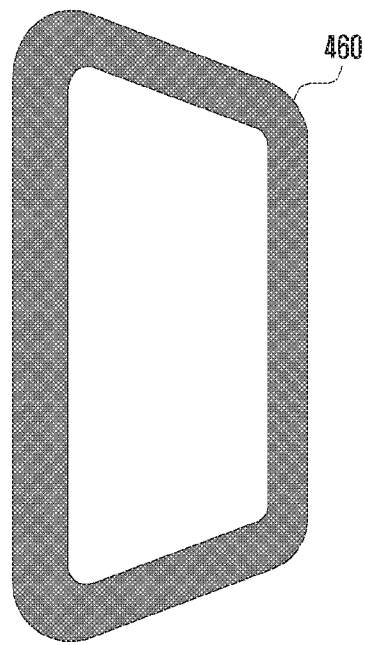
FIG. 7D illustrates an individual component that forms a conduit structure of an electronic device according to an embodiment.
Figure 7E:
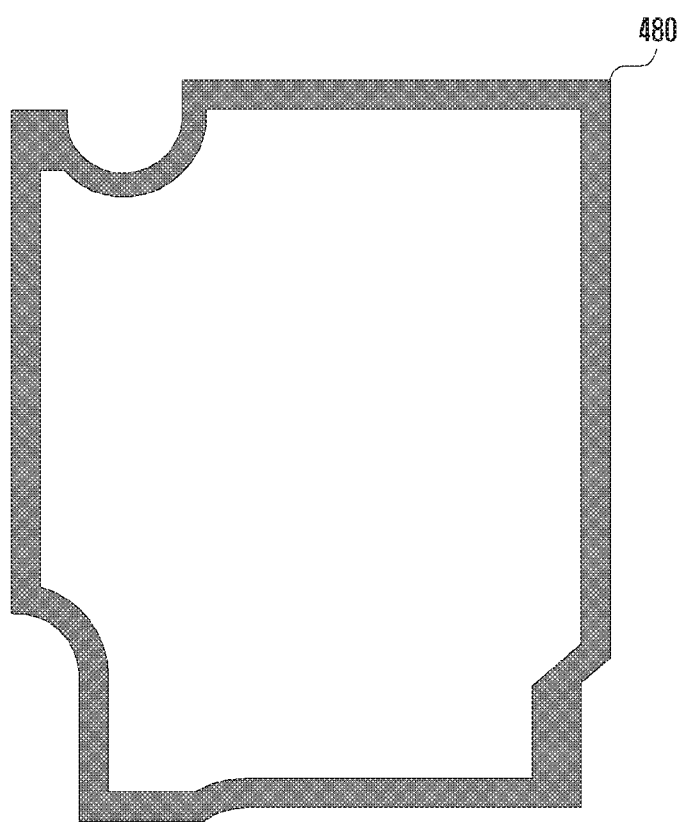
FIG. 7E illustrates an individual component that forms a conduit structure of an electronic device according to an embodiment.

FIG. 7A illustrates a component forming a conduit structure in connection with the electronic device 400 (see FIG. 4) according to an embodiment. FIG. 7B illustrates a component forming a conduit structure in connection with the electronic device 400 (see FIG. 4) according to an embodiment. FIG. 7C illustrates a component forming a conduit structure in connection with the electronic device 400 (see FIG. 4) according to an embodiment. FIG. 7D illustrates a component forming a conduit structure in connection with the electronic device 400 (see FIG. 4) according to an embodiment. FIG. 7E illustrates a component forming a conduit structure in connection with the electronic device 400 (see FIG. 4) according to an embodiment.

FIG. 7A illustrates the rear surface 412 of an inner structure 410 according to an embodiment. FIG. 7B illustrates a housing 420 according to an embodiment. FIG. 7C illustrates a speaker 430 according to an embodiment. FIG. 7D illustrates a first sealing member according to an embodiment. FIG. 7E illustrates a fourth sealing member according to an embodiment.

Referring to FIG. 7A, the seating portion 417 may be a space formed by indentation from the rear surface 412 of the inner structure 410 toward the front surface. A first sealing member 440 may be arranged on the seating portion 417 such that, when the speaker 430 (see FIG. 7C) is seated thereon, the sound does not diffuse to parts other than the first space 414, thereby preventing the sound from diffusing into the electronic device 400. The first sealing member 440 may be made of a material which can deform elastically, and which can fill and seal the space between the speaker 430 and the seating portion 417. For example, the first sealing member 440 may be made of a material such as rubber or sponge. The first sealing member 440 may be fixed to the speaker 430 or to the seating portion 417 by an adhesive material such as a tape, or may be compressed and fixed in the process of seating the speaker 430 on the seating portion 417.

The first space 414 (see FIG. 6A) according to an embodiment may be a space formed between the speaker 430 and the inner structure 410, and the duct 416 may be configured as a groove formed by indentation from the side surface 413 of the inner structure 410 toward the inside of the inner structure 410 by a predetermined depth. The second space 415 may overlap with a part of the first space 414 and with a part of the duct 416 so as to connect the first space 414 and the duct 416 to each other.

Referring to FIG. 7B, the housing 420 according to an embodiment may provide a frame for maintaining the overall shape of the electronic device 400 (see FIG. 5). Various components constituting the electronic device 400, such as a printed circuit board 600 (see FIG. 5), may be seated on the housing 420, and the inner structure 410 (see FIG. 7A) may be seated thereon. The housing 420 may have an opening 421 formed in a position corresponding to that of the duct 416 (see FIG. 7A) of the inner structure 410. When the inner structure 410 o FIG. 7A is seated such that the rear surface 412 thereof faces the housing 420, the duct 416 of the inner structure may be connected to the opening 421.

Referring to FIG. 7C, the speaker 430 according to an embodiment may be seated on the seating portion 417 of the inner structure 410 as a single speaker which has no separate case, or which is not modularized. Accordingly, there is no need for any separate additional space other than the space occupied by the speaker 430 itself, and the degree of freedom of design may be increased in connection with arranging the same inside the electronic device 400 (see FIG. 5).

Figure 8A:
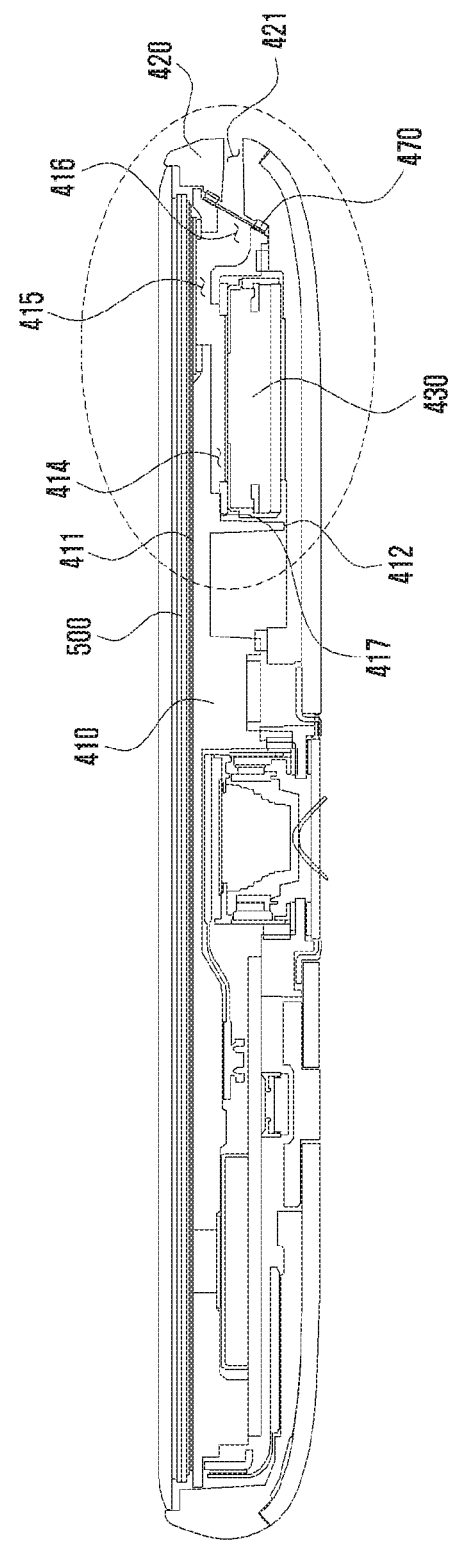
FIG. 8A illustrates a sectional view taken along line A-A of FIG. 4A.

Referring to FIG. 7D, the second sealing member 460 according to an embodiment may be formed in a shape corresponding to that of the sealing plate 450 (see FIG. 6A), and may seal the gap between the second space 415 (see FIG. 6A) and the sealing plate 450 such that the sound generated by the speaker 430 does not diffuse into the space between the display 500 (see FIG. 8A) and the inner structure 410 (see FIG. 8A). The second sealing member 460 may be made of a material which can deform elastically, and which can fill and seal the gap between the sealing plate 450 and the second space 415. For example, the second sealing member 460 may be made of an elastic material such as rubber or sponge. The second sealing member 460 may be fixed to the sealing plate 450 by an adhesive material such as a tape, or may be compressed and fixed in the process of covering and sealing the second space 415 by the sealing plate 450.

Referring to FIG. 7E, the fourth sealing member 480 according to an embodiment may seal the space between the housing 420 and the seating portion 417 (see FIG. 7A) of the inner structure 410 such that, when the inner structure 410 (see FIG. 7A) is seated on the housing 420 (see FIG. 7B), the sound generated by the speaker 430 does not diffuse to parts other than the first space 414 (see FIG. 6A). The fourth sealing member 480 may be made of a material which can deform elastically, and which can fill and seal the space between the housing 420 and the seating portion 417. For example, the fourth sealing member 480 may be made of a material such as rubber or sponge. The fourth sealing member 480 may be fixed by an adhesive material such as a tape, or may be compressed and fixed in the process of assembling the housing 420 and the inner structure 410.

Figure 8B:
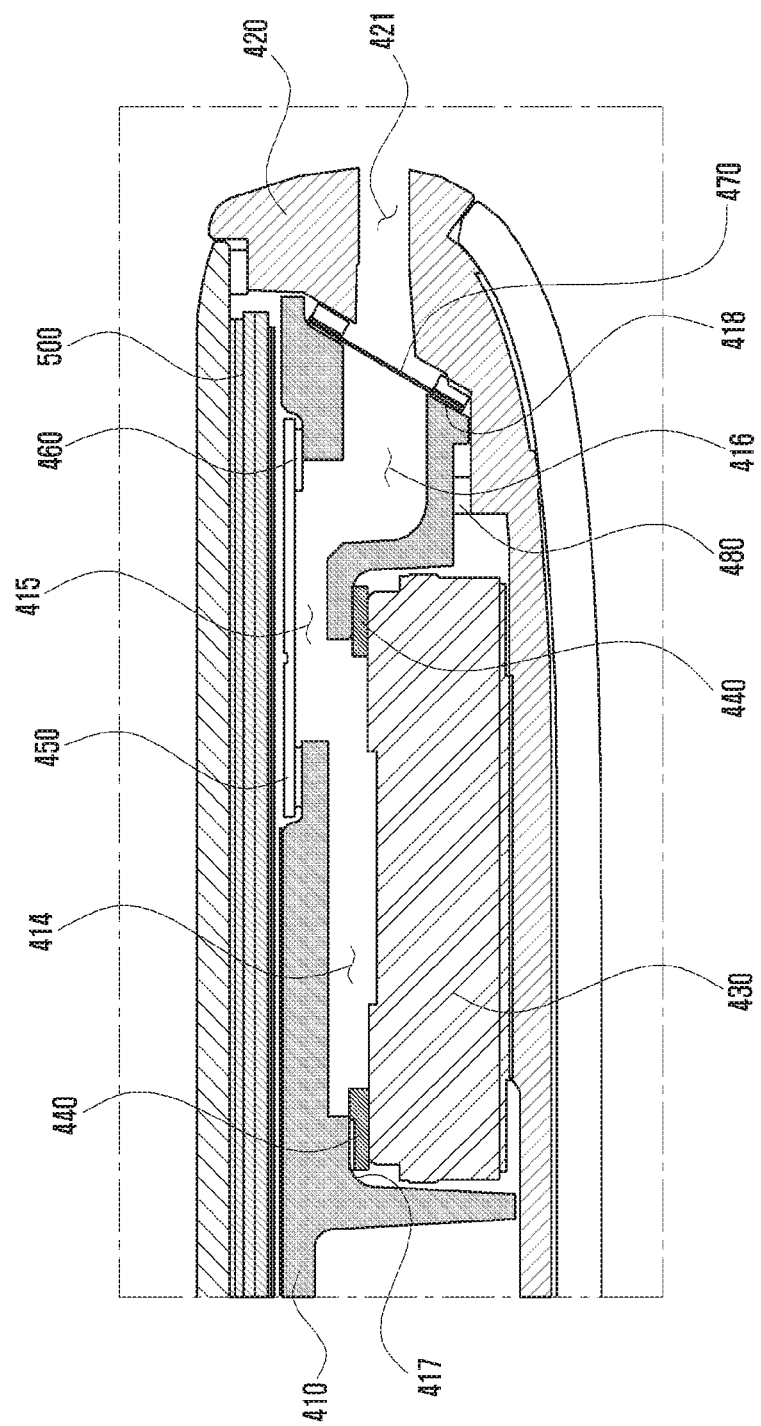
FIG. 8B illustrates a magnified view of the part indicated by the dotted line in FIG. 8A.

FIG. 8A illustrates a sectional view taken along line A-A of FIG. 4A. FIG. 8B illustrates a magnified view of the part indicated by the dotted line in FIG. 8A.

Referring to FIG. 8A and FIG. 8B, the electronic device 400 (see FIG. 4) according to an embodiment may include a display 500, an inner structure 410, and a housing 420.

With reference to the condition illustrated in FIG. 8A and FIG. 8B, the front surface of the inner structure 410 may correspond to the upward direction, the rear surface thereof may correspond to the downward direction, and the side surface thereof may correspond to the leftward/rightward direction.

The display 500 according to an embodiment may be seated on the upper side of the inner structure 410 and may be identical or similar to the display 330 of FIG. 3.

The inner structure 410 may be seated on the housing 420 according to an embodiment. The housing 420 may have an opening 421 formed in a position corresponding to that of the duct 416 of the inner structure 410.

An upward sloping surface 418 may be formed on the side surface 413 (see FIG. 6A) of the inner structure 410 according to an embodiment in a direction defined from the front surface 411 toward the rear surface. Alternatively, a downward sloping surface 418 may be formed on the side surface 413 of the inner structure 410 in a direction defined from the upper side to the lower side. This may minimize friction occurring between the inner structure 410 and the housing 420 in the process of seating the inner structure 410 on the housing 420 such that the same is naturally seated thereon.

The inner structure 410 according to an embodiment may include a seating portion 417, a first space 414, a second space 415, and a duct 416.

The seating portion 417 according to an embodiment may be a space formed by indentation from the rear surface 412 of the inner structure 410 toward the front surface such that a speaker 430 can be seated therein. A first sealing member 440 may be arranged on the seating portion 417 such that, when the speaker 430 is seated therein, the sound does not diffuse to parts other than the first space 414, thereby preventing the sound from diffusing into the electronic device 400.

The first space 414 according to an embodiment may be formed by indentation of a part of the bottom surface of the seating portion 417 toward the upper side of the inner structure 410 such that a stepped portion is formed. The second space 415 may be formed toward the upper side of the inner structure 410 so as to partially overlap with the first space 414, and the overlapping parts may be connected to each other. The second space 415 may be formed to be open to the upper side of the inner structure 410. The duct 416 may be formed toward the lower side of the inner structure 410 so as to partially overlap with the second space 415, and the overlapping parts may be connected to each other. The duct 416 may be formed to be open toward the right side of the inner structure 410.

The part of the second space 415 according to an embodiment, which is open to the upper side of the inner space, may be sealed by a sealing plate 450. A second sealing member 460 formed in a shape corresponding to that of the sealing plate 450 may be arranged between the second space 415 and the sealing plate 450. The sealing plate 450 and the second sealing member 460 may play the role of preventing the sound generated by the speaker 430 from diffusing into the electronic device 400 through the space between the display 500 and the inner structure 410, and the role of gathering the sound such that the same is discharged through the duct 416 and the opening 421 of the housing 420.

A third sealing member 470 may be arranged between the part of the duct 416 according to an embodiment, which is open to the right side of the inner structure 410, and the opening 421 of the housing 420. The third sealing member 470 may be configured to prevent moisture from entering the electronic device 400 through the opening 421 of the housing 420, and to guide the sound generated by the speaker 430 such that the same is discharged to the opening 421 without diffusing to the space between the inner structure 410 and the housing 420. The third sealing member 470 may be made of a water-repellent work mesh or a Gore-Tex® material. The peripheral part of the third sealing member 470 may be made of an elastic material and may seal the space between the inner structure 410 and the housing 420 along the part of connection between the duct 416 and the opening 421.

The fourth sealing member 480 according to an embodiment may seal the space between the housing 420 and the seating portion 417 such that, when the inner structure 410 is seated on the housing 420, the sound does not diffuse to parts other than the first space 414.

According to an embodiment, the sound generated by the speaker 430 may be transferred to the outside through the conduit structure formed by the first space 414, the second space 415, the duct 416, and the opening 421 of the housing 420.

Figure 9A:
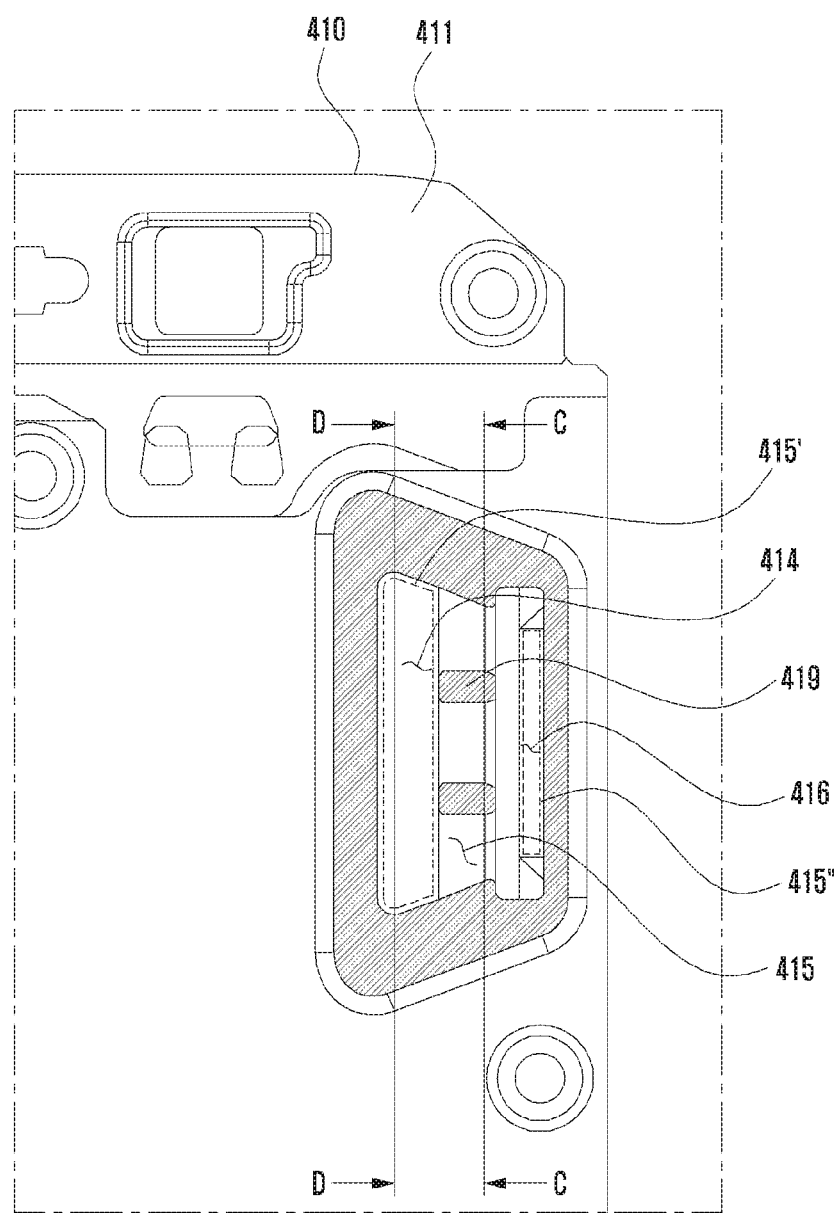
FIG. 9A illustrates a part of an inner structure according to an embodiment, which forms a conduit structure.
Figure 9B:
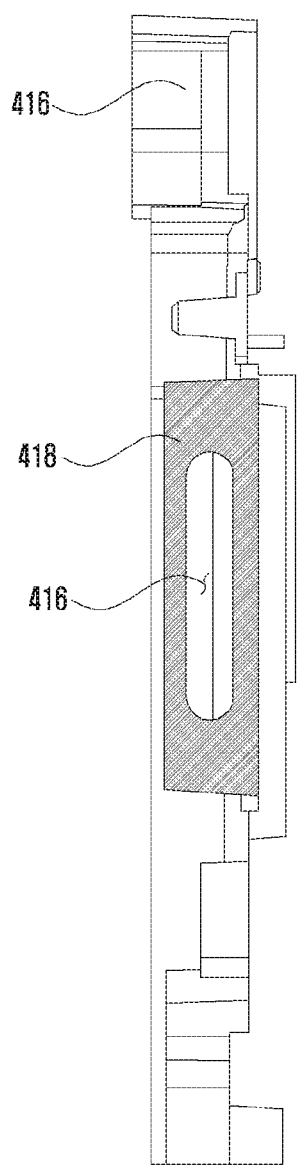
FIG. 9B illustrates a part of an inner structure according to an embodiment, which forms a conduit structure.

FIG. 9A illustrates the open part of the second space 415 according to an embodiment. FIG. 9B illustrates the open part of the duct 416 according to an embodiment.

With reference to the condition illustrated in FIG. 9A, the open area of the left end of the second space 415 may different from the open area of the right end. For example, the open area 415' of the passage part that connects the second space 415 and the first space 414 may differ from the open area 415" of the passage part that connects the second space 415 and the duct 416.

Referring to FIG. 9A and FIG. 9B, according to an embodiment, the open area 415' of the passage part that connects the second space 415 and the first space 414 may be larger than the open area 415" of the passage part that connects the second space 415 and the duct 416. Sound is generated radially by and around the speaker 430 as a wave, and the energy thereof diffuses and gradually dissipates in proportion to the distance from the speaker 430. This may appear as a sound that gradually decreases and dissipates. The sound generated by the speaker 430 is configured to be discharged through the opening 421 (see FIG. 5) of the housing 420 (see FIG. 5) after moving along the conduit structure according to an embodiment and via the duct 416. A predetermined magnitude of sound can be secured by guiding the sound generated by the speaker 430 (see FIG. 6B) such that the same is gathered to the duct 416 instead of diffusing radially and dissipating. Accordingly, in connection with the first space 414 into which the sound generated by the speaker 430 is initially introduced, the open area 415' of the passage part that connects the second space 415 and the first space 414 is formed to be large such that a large amount of sound energy can be introduced, and the open area 415" of the passage part that connects the second space 415 and the duct 416 may be formed to be narrow such that, when the introduced sound energy is discharged, the energy is concentrated and discharged through the opening 421.

The sealing plate 450 (see FIG. 6A) according to an embodiment may be formed in the shape of a trapezoid, the left side of which is relatively wider than the right side thereof, in view of the above-mentioned characteristics of the second space 415. The sealing plate 450 itself, however, may be also formed in various shapes, including a circle and a quadrangle, regardless of the structure of the second space 415.

Figure 10A:
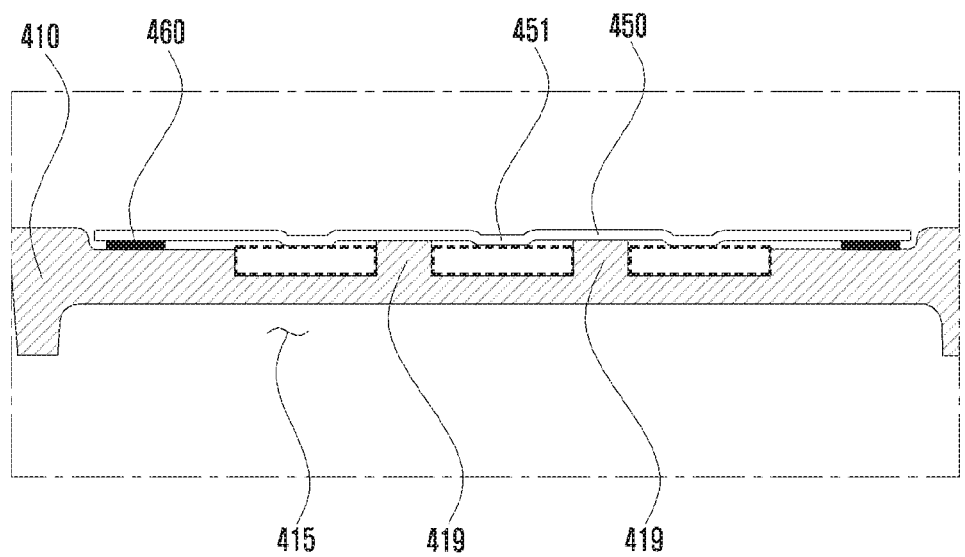
FIG. 10A illustrates a sectional view taken along line C-C of FIG. 9A.
Figure 10B:
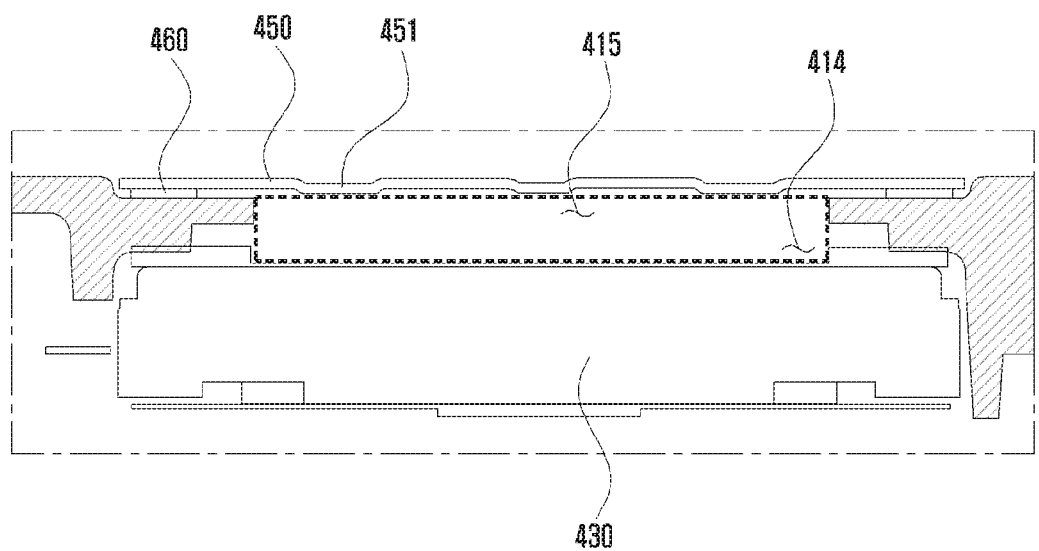
FIG. 10B illustrates a sectional view taken along line D-D of FIG. 9A.

FIG. 10A illustrates a sectional view taken along line C-C of FIG. 9A. FIG. 10B illustrates a sectional view taken along line D-D of FIG. 9A.

Referring to FIG. 10A, a part of the surface of the sealing plate 450 according to an embodiment may protrude so as to form a beading 451. The resistance of the sealing plate 450 against bending deformation may be increased when a part of the sealing plate 450 protrudes/deforms so as to form a beading 451, compared with the sealing plate 450 illustrated in FIG. 6A, which has a simple plate shape.

A support rib 419 may be formed on the boundary part of the inner structure 410 according to an embodiment, which distinguishes between the first space 414 (see FIG. 9A) and the duct 416 (see FIG. 9A), so as to protrude toward the second space 415. The support rib 419 may contact the sealing plate 450 so as to prevent the sealing plate 450 from sagging.

FIG. 10B illustrates a sectional view taken along line D-D of FIG. 9A. The quadrangular box indicated by the dotted line may correspond to a passage part that connects the first space 414 and the second space 415 to each other.

Figure 11:
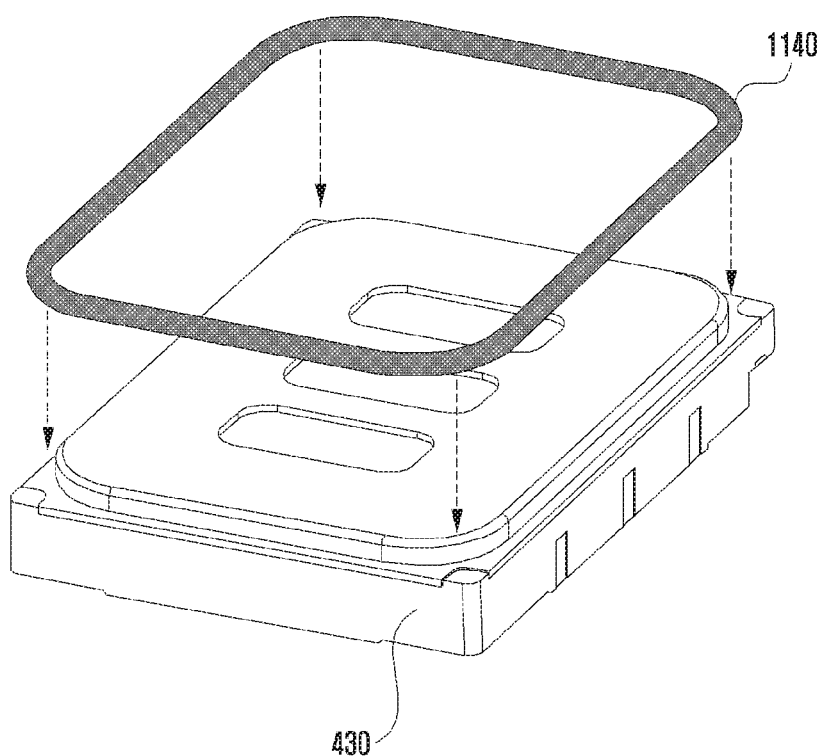
FIG. 11 illustrates a speaker and a first sealing member according to another embodiment.
Figure 12:
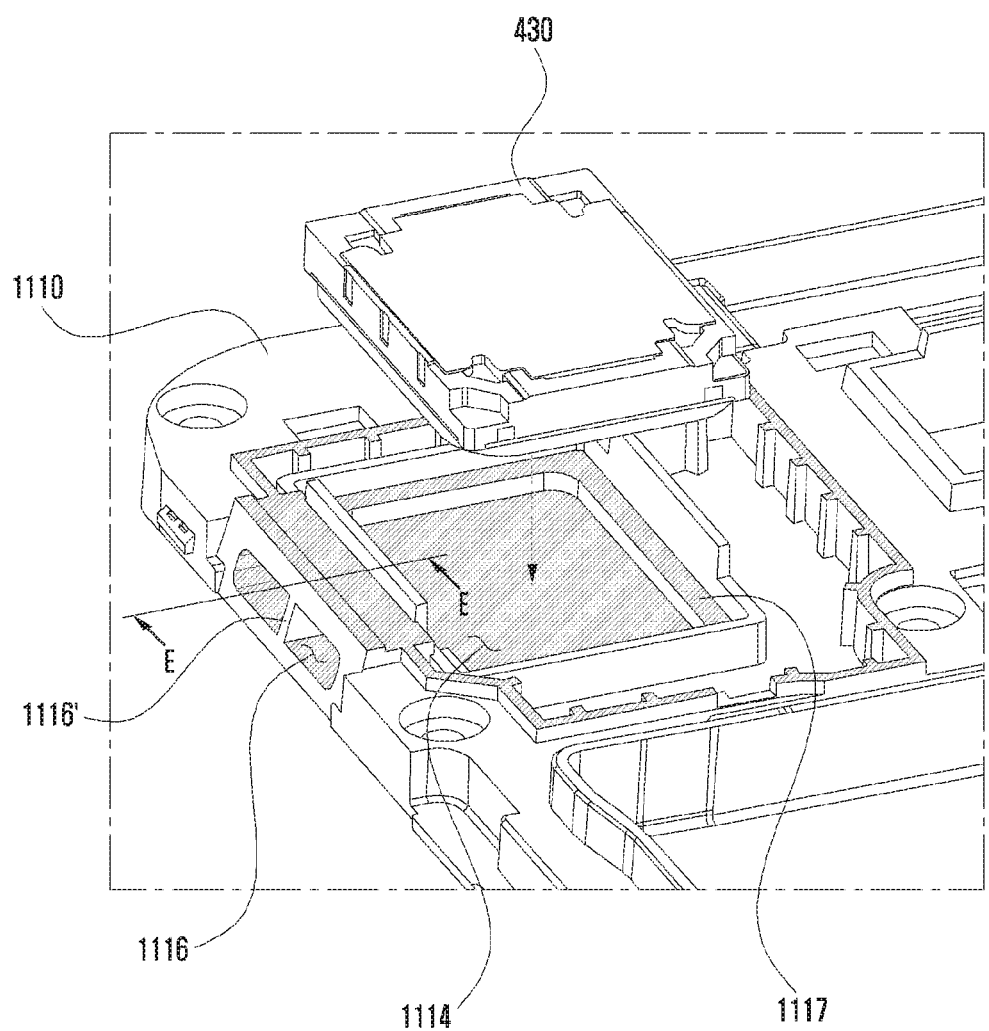
FIG. 12 illustrates a seating portion and a speaker according to another embodiment.
Figure 13:
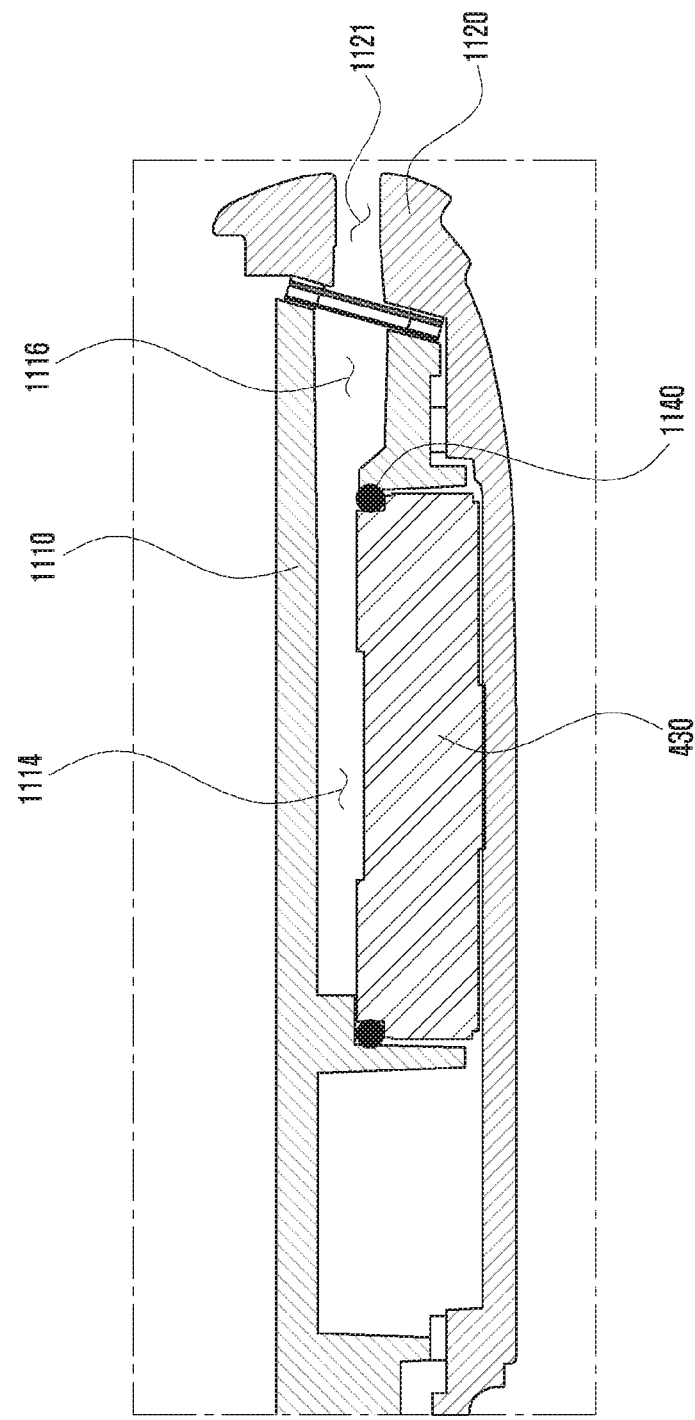
FIG. 13 illustrates a sectional view taken along line E-E of FIG. 12.
Figure 14:
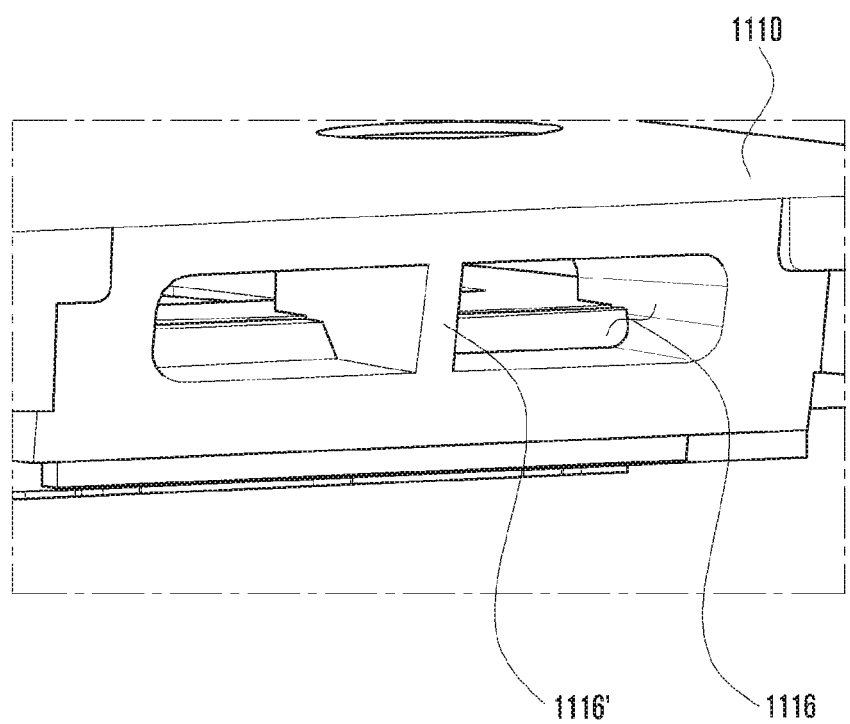
FIG. 14 illustrates a duct of an inner structure according to another embodiment.

FIG. 11 illustrates an electronic device according to another embodiment. FIG. 12 illustrates an electronic device according to another embodiment. FIG. 13 illustrates an electronic device according to another embodiment. FIG. 14 illustrates an electronic device according to another embodiment.

In the following description of an electronic device according to another embodiment illustrated in FIG. 11 to FIG. 14, repeated descriptions of the same features as those of the electronic device described with reference to FIG. 4 to FIG. 10 will be omitted for clarity.

FIG. 11 illustrates a speaker and a first sealing member according to another embodiment.

In connection with the electronic device according to another embodiment, the position of the first sealing member 1140 arranged to seal the space between the bottom surface of the seating portion 1117 (see FIG. 12) and the speaker 430 may be modified.

Referring to FIG. 11, the first sealing member 1140 may be arranged near the edge of the speaker 430 such that the same is positioned on a side surface of the speaker 430 and on a wall surface of the seating portion 1117 (see FIG. 12). The first sealing member 1140 may be formed in a ring shape and may be coupled such that the first sealing member 1140 is inserted into the edge of the speaker 430.

FIG. 12 illustrates a seating portion 1117 and a speaker 430 according to another embodiment.

The speaker 430, to which the first sealing member 1140 is coupled as in FIG. 11, may be seated on the seating portion 1117 of the inner structure 1110 as illustrated in FIG. 12.

FIG. 13 illustrates a sectional view taken along line E-E of FIG. 12. Referring to FIG. 13, the first sealing member 1140 may be positioned between the side surface of the speaker 430 and the wall surface of the seating portion 1117. This formation may directly connect the first space 1114 and the duct 1116.

According to another embodiment, the sound generated by the speaker 430 may be transferred to the outside through a conduit structure formed by the first space 1114, the duct 1116, and the opening 1121 of the housing 1120.

FIG. 14 illustrates a duct 1116 of an inner structure 1110 according to another embodiment.

Referring to FIG. 14, since the first sealing member 1140 is positioned between the side surface of the speaker 430 and the wall surface of the seating portion 1117, the first sealing member 1140 may detach toward the duct 1116. A blocking rib 1116' may be arranged to prevent such detachment.

An electronic device according to an embodiment may include a display 500; a speaker 430; an inner structure 410 including a front surface 411 on which the display 500 is seated, a rear surface 412 having a seating portion 417 for the speaker 430 formed thereon, and a side surface connecting the front surface 411 and the rear surface 412; and a housing 420 in which the inner structure 410 is seated. The inner structure 410 may include a first space 414 formed by indentation of a part of the bottom surface of the seating portion 417 toward the front surface of the inner structure 410; a second space 415 formed to be open toward the front surface of the inner structure 410 such that the second space 415 is connected to and partially overlaps with the first space 414 in a direction defined toward the front surface of the inner structure 410; and a duct 416 formed to be open toward the side surface of the inner structure 410 such that the duct 416 is connected to and partially overlaps with the second space 415 in a direction defined toward the rear surface of the inner structure 410.

Characteristically, the housing 420 may have an opening 421 formed in a position corresponding to the position of the duct 416 of the inner structure 410.

Characteristically, the open area of a part of the duct 416, which is connected to the second space 415, may differ from the open area of a part of the duct 416, which is open to the side surface of the inner structure 410.

Characteristically, the open areas of both ends of the opening 421 may differ from each other.

Characteristically, the electronic device may further include a first sealing member 440 arranged between the speaker 430 and the bottom surface of the seating portion 417.

Characteristically, the electronic device may further include a sealing plate 450 positioned between the front surface 411 of the inner structure 410 and the display 500 so as to seal a part of the second space 415, which is open toward the front surface 411 of the inner structure 410.

Characteristically, the electronic device may further include a second sealing member 460 arranged between the sealing plate 450 and the inner structure 410.

Characteristically, an upward sloping surface 418 may be formed on the side surface of the inner structure 410 in a direction defined from the front surface 411 toward the rear surface.

Characteristically, the electronic device may further include a third sealing member 470 arranged between the duct 416 of the inner structure 410 and the opening 421 of the housing 420.

Characteristically, the seating portion 417 may be connected to the outside of the housing 420 through the first space 414, the second space 415, the duct 416, and the opening 421.

Characteristically, the sealing plate 450 may be formed such that the length of a corner positioned near a side connecting the second space 415 and the first space 414 is larger than the length of a corner positioned near a side connecting the second space 415 and the duct 416.

Characteristically, the electronic device may further include a support rib 419 formed on a boundary part that distinguishes between the first space 414 and the duct 416 so as to protrude toward the second space 415.

A conduit structure according to an embodiment may include an inner structure 410 including a front surface 411 on which a display 500 is seated, a rear surface 412 having a seating portion 417 for a speaker 430 formed thereon, and a side surface connecting the front surface 411 and the rear surface 412; and a housing 420 in which the inner structure 410 is seated. The inner structure 410 may include a first space 414 formed by indentation of a part of the bottom surface of the seating portion 417 toward the front surface of the inner structure 410; a second space 415 formed to be open toward the front surface of the inner structure 410 such that the second space 415 is connected to and partially overlaps with the first space 414 in a direction defined toward the front surface of the inner structure 410; and a duct 416 formed to be open toward the side surface of the inner structure 410 such that the duct 416 is connected to and partially overlaps with the second space 415 in a direction defined toward the rear surface of the inner structure 410.

Characteristically, the housing 420 may have an opening 421 formed in a position corresponding to the position of the duct 416 of the inner structure 410.

Characteristically, the open area of a part of the duct 416, which is connected to the second space 415, may differ from the open area of a part of the duct 416, which is open to the side surface of the inner structure 410.

Characteristically, the open areas of both ends of the opening 421 may differ from each other.

Characteristically, the conduit structure may further include a sealing plate 450 positioned between the front surface 411 of the inner structure 410 and the display 500 so as to seal a part of the second space 415, which is open toward the front surface 411 of the inner structure 410.

Characteristically, the conduit structure may further include a second sealing member 460 arranged between the sealing plate 450 and the inner structure 410.

Characteristically, an upward sloping surface 418 may be formed on the side surface of the inner structure 410 in a direction defined from the front surface 411 toward the rear surface.

Characteristically, the conduit structure may further include a third sealing member 470 arranged between the duct 416 of the inner structure 410 and the opening 421 of the housing 420.

Characteristically, the seating portion 417 may be connected to the outside of the housing 420 through the first space 414, the second space 415, the duct 416, and the opening 421.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a display;
   a speaker;
   an inner structure comprising a front surface on which the display is seated, a rear surface having a seating portion for the speaker formed thereon, and a side surface connecting the front surface and the rear surface; and
   a housing in which the inner structure is seated, wherein the inner structure comprises:
      a first space formed by indentation of a part of a bottom surface of the seating portion toward the front surface of the inner structure;
      a second space formed to be open toward the front surface of the inner structure such that the second space is connected to and partially overlaps with the first space in a direction defined toward the front surface of the inner structure; and
      a duct formed to be open toward the side surface of the inner structure such that the duct is connected to and partially overlaps with the second space in a direction defined toward the rear surface of the inner structure.

2. The electronic device of claim 1, wherein the housing has an opening formed in a position corresponding to the position of the duct of the inner structure.

3. The electronic device of claim 1, wherein an open area of a part of the duct, which is connected to the second space, differs from an open area of a part of the duct, which is open to the side surface of the inner structure.

4. The electronic device of claim 2, wherein open areas of both ends of the opening differ from each other.

5. The electronic device of claim 1, further comprising a first sealing member arranged between the speaker and the bottom surface of the seating portion.

6. The electronic device of claim 1, further comprising a sealing plate positioned between the front surface of the inner structure and the display so as to seal a part of the second space, which is open toward the front surface of the inner structure.

7. The electronic device of claim 6, further comprising a second sealing member arranged between the sealing plate and the inner structure.

8. The electronic device of claim 1, wherein an upward sloping surface is formed on the side surface of the inner structure in a direction defined from the front surface toward the rear surface.

9. The electronic device of claim 2, further comprising a third sealing member arranged between the duct of the inner structure and the opening of the housing.

10. The electronic device of claim 2, wherein the seating portion is connected to an outside of the housing through the first space, the second space, the duct, and the opening.

11. The electronic device of claim 6, wherein the sealing plate is formed such that a length of a corner positioned near a side connecting the second space and the first space is larger than a length of a corner positioned near a side connecting the second space and the duct.

12. The electronic device of claim 1, further comprising a support rib formed on a boundary part that distinguishes between the first space and the duct so as to protrude toward the second space.

13. A conduit structure comprising:
    an inner structure comprising a front surface on which a display is seated, a rear surface having a seating portion for a speaker formed thereon, and a side surface connecting the front surface and the rear surface; and
    a housing in which the inner structure is seated, wherein the inner structure comprises:
       a first space formed by indentation of a part of a bottom surface of the seating portion toward the front surface of the inner structure;
       a second space formed to be open toward the front surface of the inner structure such that the second space is connected to and partially overlaps with the first space in a direction defined toward the front surface of the inner structure; and
       a duct formed to be open toward the side surface of the inner structure such that the duct is connected to and partially overlaps with the second space in a direction defined toward the rear surface of the inner structure.

14. The conduit structure of claim 13, wherein the housing has an opening formed in a position corresponding to the position of the duct of the inner structure.

15. The conduit structure of claim 13, wherein an open area of a part of the duct, which is connected to the second space, differs from an open area of a part of the duct, which is open to the side surface of the inner structure.

16. The conduit structure of claim 14, wherein open areas of both ends of the opening differ from each other.

17. The conduit structure of claim 13, further comprising a sealing plate positioned between the front surface of the inner structure and the display so as to seal a part of the second space, which is open toward the front surface of the inner structure.

18. The conduit structure of claim 17, further comprising a second sealing member arranged between the sealing plate and the inner structure.

19. The conduit structure of claim 13, wherein an upward sloping surface is formed on the side surface of the inner structure in a direction defined from the front surface toward the rear surface.

20. The conduit structure of claim 14, further comprising a third sealing member arranged between the duct of the inner structure and the opening of the housing.

* * * * *